United States Patent [19]
Liu et al.

[11] Patent Number: 5,949,722
[45] Date of Patent: Sep. 7, 1999

[54] I/O BIAS CIRCUIT INSENSITIVE TO INADVERTENT POWER SUPPLY VARIATIONS FOR MOS MEMORY

[75] Inventors: Lawrence Liu, Menlo Park; Li-Chun Li, Los Gatos, both of Calif.; Michael Murray, Bellevue, Wash.

[73] Assignee: Mosel Vitelic, San Jose, Calif.

[21] Appl. No.: 09/062,175

[22] Filed: Apr. 16, 1998

[51] Int. Cl.[6] .................................................. G11C 7/00
[52] U.S. Cl. ...................... 365/189.11; 365/207; 365/208
[58] Field of Search ............................... 365/189.11, 207, 365/208, 185.18, 189.09

[56] References Cited

U.S. PATENT DOCUMENTS

| | | | |
|---|---|---|---|
| 4,271,487 | 6/1981 | Craycraft et al. | 365/189 |
| 4,932,002 | 6/1990 | Houston | 365/241 |
| 5,023,841 | 6/1991 | Akrout et al. | 365/205 |
| 5,434,821 | 7/1995 | Watanabe et al. | 365/203 |
| 5,526,314 | 6/1996 | Kumar | 365/207 |
| 5,812,474 | 9/1998 | Liu et al. | 365/207 |

*Primary Examiner*—David Nelms
*Assistant Examiner*—Hien Nguyen
*Attorney, Agent, or Firm*—Skjerven Morrill MacPherson Franklin & Friel LLP; Michael Shenker; Barmak Sani

[57] ABSTRACT

An input/output bias circuit used in MOS memory devices is insensitive to inadvertent power supply variations. A memory cell, programmed to a given state, has a terminal connected to a first node. A first MOS switch, normally open, is connected between the first node and a ground terminal. A biasing circuit and a second MOS switch, normally closed, are connected between a power supply terminal and the first node. The first node is connected to one of two input terminals of a sense amplifier, the second input terminal being connected to a sense amplifier enable/disable signal. Upon selecting the memory cell, the first switch is turned on and the second switch is turned off for a first period of time. During this period, the biasing circuit and the first switch interact to bias the first node to a potential equal to one threshold voltage below the supply voltage. During a second period of time immediately after the first period, both switches 1 and 2 are turned off. During this period, the biasing circuit interacts with the memory cell to bias the first node to a potential corresponding to the state of the memory cell. Also during the second period of time the sense amplifier is enabled to detect the state of the memory cell by sensing the potential on the first node.

6 Claims, 4 Drawing Sheets

5,949,722

1

I/O BIAS CIRCUIT INSENSITIVE TO INADVERTENT POWER SUPPLY VARIATIONS FOR MOS MEMORY

FIELD OF THE INVENTION

The present invention relates in general to Input/Output (I/O) bias circuits for MOS memory devices, and more particularly to an I/O bias circuit which is insensitive to inadvertent power supply variations.

DESCRIPTION OF THE RELATED ART

In designing stand-alone semiconductor memory devices, it is a common requirement that the device operate properly over a specified power supply range. For example, the designer needs to ensure that the device operates and meets particular target spec numbers over the power supply range of 4.5V to 5.5V.

I/O bias circuits are commonly used in memory devices to assist in detecting the state of selected memory cells. A conventional I/O bias circuit used for such purpose is shown in FIG. 1a. This circuit however, under certain power supply conditions within the allowed supply range, fails to operate properly. The operation of the circuit of FIG. 1a and the failing mechanism are described in more detail hereinafter.

In FIG. 1a memory array 7 contains a fixed number of memory cells (not shown) one or more of which are selected during each read cycle. B/L 9 and $\overline{B/L}$ 10 lines exemplify two of many bit lines running through the memory array 7, and each of these bit lines have a number of memory cells connected to them. When a memory cell connected to, for example B/L 9, is selected a signal corresponding to the state of the selected memory cell is developed on B/L 9 and $\overline{B/L}$ 10 lines. Then, upon selecting the NMOS transistors M4 and M5 via the Y-dec signal 15, the developed signals on B/L 9 and $\overline{B/L}$ 10 lines are provided to the sense amplifier 6 via the I/O 11 and $\overline{I/O}$ 12 lines.

Also shown in FIG. 1a are NMOS bias transistors M1, M2 and M3 being connected to I/O 11 and $\overline{I/O}$ 12 lines. The control gates of transistors M1, M2 and M3 as well as the drain electrodes of transistors M2 and M3 are connected to $V_{CC}$ 14. Under this biasing condition, the source electrodes of transistors M2 and M3 can rise in voltage to a maximum of one threshold voltage below their gate potentials, i.e., $V_{CC}$ minus $V_T$. Therefore, the maximum voltage which the I/O 11 and $\overline{I/O}$ 12 lines can be charged to is $V_{CC}$ minus $V_T$.

Under D.C. conditions, with transistors M4 and M5 in the off state, transistors M1, M2 and M3 bias and equalize I/O 11 and $\overline{I/O}$ 12 lines to a voltage level equal to $V_{CC}$ minus $V_T$. With transistors M4 and M5 in the on state, transistors M1, M2 and M3 interact with the developed signals on B/L 9 and $\overline{B/L}$ 10 lines to bias I/O 11 and $\overline{I/O}$ 12 lines to voltage levels corresponding to the state of the selected memory cell.

Under A.C. conditions, upon accessing a memory cell, the state of the memory cell needs to be detected. Given that memory cells typically provide very small signals, sense-amplifiers are used for signal amplification. In FIG. 1a sense amplifier 6 is used for such purpose. Prior to start of the sensing cycle, certain nodes in the circuit of FIG. 1a need to be set to specific voltage levels. For example, it is critical that I/O 11 and $\overline{I/O}$ 12 lines are always precharged and equalized to $V_{CC}$ minus Vt prior to start of the sensing cycle. Improper biasing of I/O 11 and $\overline{I/O}$ 12 lines may lead to faulty sensing.

The circuit of FIG. 1a however fails to properly bias I/O 11 and $\overline{I/O}$ 12 lines to $V_{CC}$ minus $V_T$ when the $V_{CC}$ supply

2

14 suddenly drops within the permissible power supply range, i.e., from 5.5V to 4.5V. It is a common occurrence with circuit boards having memory devices, that due to current surges the power supply may drop for a period of time. If the supply voltage after the drop is still within the power supply range indicated in the specification, the memory device needs to remain operational.

FIG. 1b shows a timing diagram wherein $V_{CC}$ voltage level is shown to drop from $V_{CC1}$ to $V_{CC2}$ at time $t_0$ prior to the start of a read cycle at time t1. Prior to time $t_0$, when $V_{CC}=V_{CC1}$, I/O 11 and $\overline{I/O}$ 12 lines are biased at $V_{CC1}$ minus Vt. After time $t_0$ when $V_{CC}$ drops to $V_{CC2}$, I/O 11 and $\overline{I/O}$ 12 lines should re-bias to $V_{CC2}$ minus Vt. But, at time $t_0$ when $V_{CC}$ on line 14 drops, transistors M1, M2 and M3 instantly shut off because the gate to source potential of each of the three devices falls below the threshold voltage of the respective devices. With transistors M1, M2 and M3 in the off state, the voltages on I/O 11 and $\overline{I/O}$ 12 lines remain at $V_{CC1}$ minus Vt while $V_{CC}=V_{CC2}$. This coupled with the lack of a discharge mechanism on the I/O 11 and $\overline{I/O}$ 12 lines result in trapping of charge on I/O 11 and $\overline{I/O}$ 12 equal in amount to the difference between $V_{CC1}$ potential and $V_{CC2}$ potential. As a result, I/O 11 and $\overline{I/O}$ 12 lines will be improperly biased to $V_{CC1}$ minus Vt at a time when the sense amplifier 6 as well as the rest of the circuitry are operating under $V_{CC2}$ supply condition. This will lead to faulty sensing, and in turn incorrect output data.

FIG. 2 shows an I/O bias scheme wherein high resistive paths 16 and 17 to ground terminal 18 are provided on I/O 11 and $\overline{I/O}$ 12 lines in order to eliminate the charge trapping problem. The resistive paths 16 and 17 provide leakage paths for the charge trapped on lines I/O 11 and $\overline{I/O}$ 12 in the case of a drop on the $V_{CC}$ terminal 14. This scheme is effective under D.C. conditions where upon a drop in the $V_{CC}$ supply, sufficient amount of time is available for the trapped charge to discharge through resistors 16 and 17 prior to a new read cycle. However, under A.C. conditions wherein for example $V_{CC}$ 14 drops just prior to the start of a read cycle, there may not be sufficient time within which the trapped charge can be discharged, resulting in faulty sensing.

The scheme of FIG. 2 suffers from two additional drawbacks. First, the implementation of the high resistive paths 16 and 17 on silicon requires the use of a highly resistive material, the layout for which consumes a fair amount of silicon area. Considering that one I/O bias circuit with two resistors is needed for each output block, depending on the number of output blocks, a significant amount of the die area could be consumed by the resistors. Second, each resistor provides a constant D.C. current path from $V_{CC}$ to ground leading to consumption of D.C. power. Again, depending on the number of output blocks, the D.C. power consumption due to the resistors could be significant.

FIG. 3a shows another scheme directed at eliminating the trapped charge. As shown, transistors M6 and M7 with their control gates connected to a clock φ, are used to provide a discharge path for the trapped charge on I/O 11 and $\overline{I/O}$ 12 lines. The clock φ may be internally generated using an address transition detection scheme, or may be externally provided. As shown in the diagram of FIG. 3b, a pulse is provided on clock φ1 having a rising edge immediately after the start of a new address cycle at time to and a falling edge prior to start of the sensing cycle at time $t_1$. For the duration of the pulse width, transistors M6 and M7 are in the on state, discharging the charge trapped on I/O 11 and $\overline{I/O}$ 12 lines.

Even though this scheme eliminates both the high D.C. power consumption as well as the silicon area penalty of the resistors of circuit of FIG. 2, it suffers from two other drawbacks. First, the device sizes of transistors M6 and M7 along with the pulse width of the clock φ can be optimized to discharge only a specific amount of charge trapped on lines I/O 11 and $\overline{I/O}$ 12, i.e., an amount equal to the difference between 5.5V and 4.5V. If the amount of trapped charge varies, which may be the case depending on the amount of drop on $V_{CC}$ terminal 14, I/O 11 and $\overline{I/O}$ 12 lines will not be discharged to the proper bias levels prior to the start of the sensing cycle. Therefore, fine-tuning the clock pulse and the sizes of transistors M6 and M7 may prove a difficult if not an impossible task.

Second, in the case where the $V_{CC}$ terminal 14 does not drop in voltage and therefore no charge is trapped on I/O 11 and $\overline{I/O}$ 12 lines, the clock pulse will result in unnecessary discharging of I/O 11 and $\overline{I/O}$ 12 lines. This again leads to improper biasing of I/O 11 and $\overline{I/O}$ 12 lines prior to the sensing cycle.

SUMMARY

An I/O bias circuit used in MOS memory devices which is insensitive to inadvertent power supply variations is disclosed. In accordance with the present invention a memory cell, being programmed to a particular state, has a terminal which is connected to a first node. A first switch, normally open, is connected between the first node and the ground terminal. A second switch, normally closed, is connected between the first node and the power supply terminal. Also connected between the power supply terminal and the first node is a biasing circuit.

A sense amplifier receives the signal on the first node at its input terminal. The sense amplifier also receives an enable/disable signal. The sense amplifier latches its output signal through a latch circuitry at its output terminal.

Upon selecting the memory cell, the first switch is closed and the second switch is opened for a first period of time. During this period, the biasing circuit and the first switch interact to bias the first node to a potential equal to one threshold voltage below the supply voltage.

During a second period of time immediately after the first period the second switch is kept open with the first switch also being open. During this period, the biasing circuit interacts with the memory cell to bias the first node to a potential determined by the relative strengths of the memory cell and the biasing circuitry. Also, during the second period the sense amplifier is enabled via the enable/disable signal to detect the state of the signal provided at its first input terminal.

One feature of the present invention is that no charge trapping occurs and the I/O bias circuit operates properly over the permissible power supply range, even when the power supply varies inadvertently.

Yet another feature of the present invention is that the biasing circuit consumes no additional D.C. power.

Yet another feature of the present invention is that the above mentioned features are achieved with minimal die size penalty.

These and other features will become more apparent from the following description and the accompanying drawings.

BRIEF DESCRIPTION OF THE DRAWINGS

FIG. 1b shows a timing diagram for the circuit of FIG. 1a.

FIG. 2 shows an I/O bias scheme directed at eliminating the charge trapping problem of the circuit of FIG. 1a.

FIG. 3a shows another I/O bias scheme directed at eliminating the charge trapping problem of the circuit of FIG. 1a.

FIG. 4b shows the timing diagram for the circuit of FIG. 4a.

DETAILED DESCRIPTION OF THE PREFERRED EMBODIMENT

Figure 4A:
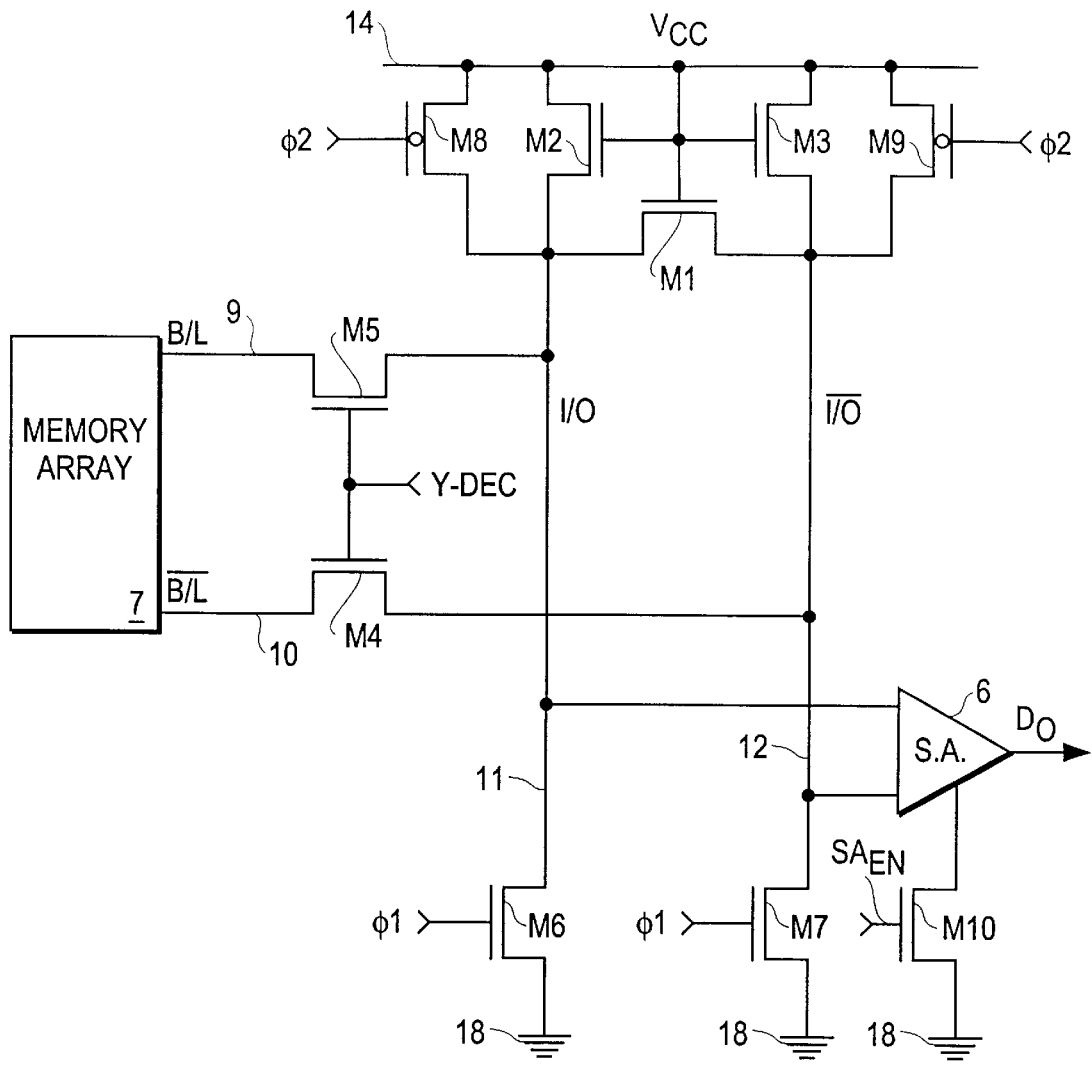
FIG. 4a shows the preferred embodiment of the present invention.

In accordance with the present invention an I/O bias circuit used in MOS memory devices which is insensitive to inadvertent power supply variations is disclosed. FIG. 4a shows one embodiment of the present invention.

In FIG. 4a memory array 7 contains a fixed number of memory cells (not shown) one or more of which are selected during each read cycle. B/L 9 and $\overline{B/L}$ 10 lines exemplify two of many bit lines running through the memory array 7, and each of these bit lines has a number of memory cells connected to it. When a memory cell connected to, for example B/L 9, is selected, a signal corresponding to the state of the memory cell is developed on B/L 9 and $\overline{B/L}$ 10 lines. Then, upon selecting the NMOS transistors M4 and M5 via the Y-dec signal 15, the developed signals on B/L 9 and $\overline{B/L}$ 10 lines are provided to the sense amplifier 6 via the I/O 11 and $\overline{I/O}$ 12 lines.

Also shown in FIG. 4a are NMOS bias transistors M1, M2 and M3 being connected to I/O 11 and $\overline{I/O}$ 12 lines. The control gates of transistors M1, M2 and M3 as well as the drain electrodes of transistors M2 and M3 are connected to $V_{CC}$ 14. The source and drain terminals of transistor M1 are connected to I/O 11 and $\overline{I/O}$ 12 lines, respectively. The source electrodes of transistors M2 and M3 are also connected to I/O 11 and $\overline{I/O}$ 12 lines, respectively.

FIG. 4a shows PMOS transistors M8 and M9 having their source electrodes connected to the $V_{CC}$ terminal 14, their gate electrodes connected to clock φ2 and their drain electrodes connected to I/O 11 and $\overline{I/O}$ 12 lines, respectively. Under this biasing condition, when transistors M8 and M9 are in the off state, the potential on I/O 11 and $\overline{I/O}$ 12 lines can rise to a maximum of one threshold voltage below the gate potential of transistors M2 and M3, namely to $V_{CC}$ minus $V_T$. When transistors M8 and M9 are in the on state, the potential on I/O 11 and $\overline{I/O}$ 12 lines can rise to full $V_{CC}$ since these two transistors are p-type.

As shown in FIG. 4a, transistors M6 and M7 connect I/O 11 and $\overline{I/O}$ 12 lines to ground. The drain electrodes of transistors M6 and M7 are connected to I/O 11 and $\overline{I/O}$ 12, respectively, the gate electrodes are connected to clock φ1 and the source electrodes are connected to the ground terminal 18. Also shown in FIG. 4a is transistor M10 being connected to sense amplifier 6. Transistor M10 functions as the switching device, providing the ground terminal 18 to the sense amplifier 6 when transistor M10 is enabled by $SA_{EN}$ signal. When transistor M10 is disabled, the sense amplifier 6 is essentially disabled. In this manner, transistor M10 can be viewed to function as part of a latching mechanism wherein after the signals on I/O 11 and $\overline{I/O}$ 12 are sensed by the sense amplifier 6, the data on output $D_0$ is latched and the sense amplifier 6 is disabled by $SA_{EN}$ signal. The latching of the data relieves I/O 11 and $\overline{I/O}$ 12 lines from carrying the respective memory cell data and enables these lines to be precharged to $V_{CC}$.

Under D.C. conditions, clocks φ1 and φ2 as well as the $SA_{EN}$ signal are in the low state. Therefore, transistors M6, M7 and M10 are all in the off state while transistors M8 and M9 are in the on state. As a result, I/O 11 and $\overline{I/O}$ 12 lines are charged up to the full $V_{CC}$ potential and the sense amplifier 6 is disabled. With the sense amplifier 6 disabled, the data sensed in the previous read cycle is latched through the latching mechanism not shown in FIG. 4a.

Figure 4B:
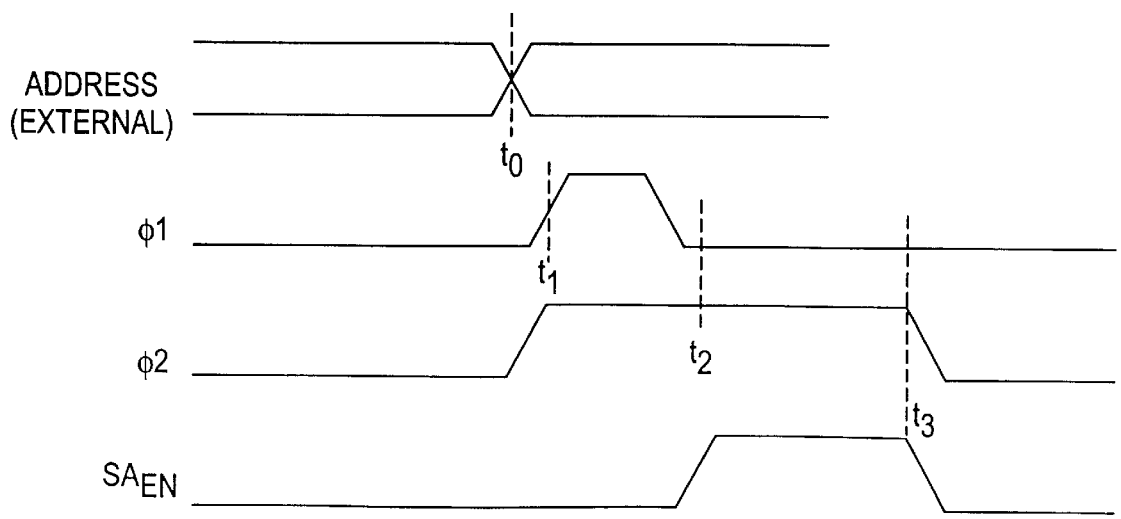

Next, the operation of the circuit of FIG. 4a will be described under A.C. conditions using the timing diagram of FIG. 4b. FIG. 4b shows the timing for external addresses, clocks φ1 and φ2 and the $SA_{EN}$ signal. The addresses are shown as changing at, time $t_0$. A short pulse having a rising edge at time $t_1$ and a falling edge at time $t_2$ is generated on clock φ1 immediately after the address change. A longer pulse having a rising edge at time $t_1$ and a falling edge at time $t_3$ is also generated on clock φ2 immediately after the address change. The $SA_{EN}$ signal is shown as making a low to high transition at time $t_2$ and a subsequent high to low transition at time $t_3$. During the period in which the $SA_{EN}$ signal is high, the sense amplifier 6 is enabled and the sensing cycle takes place.

Figure 1A:
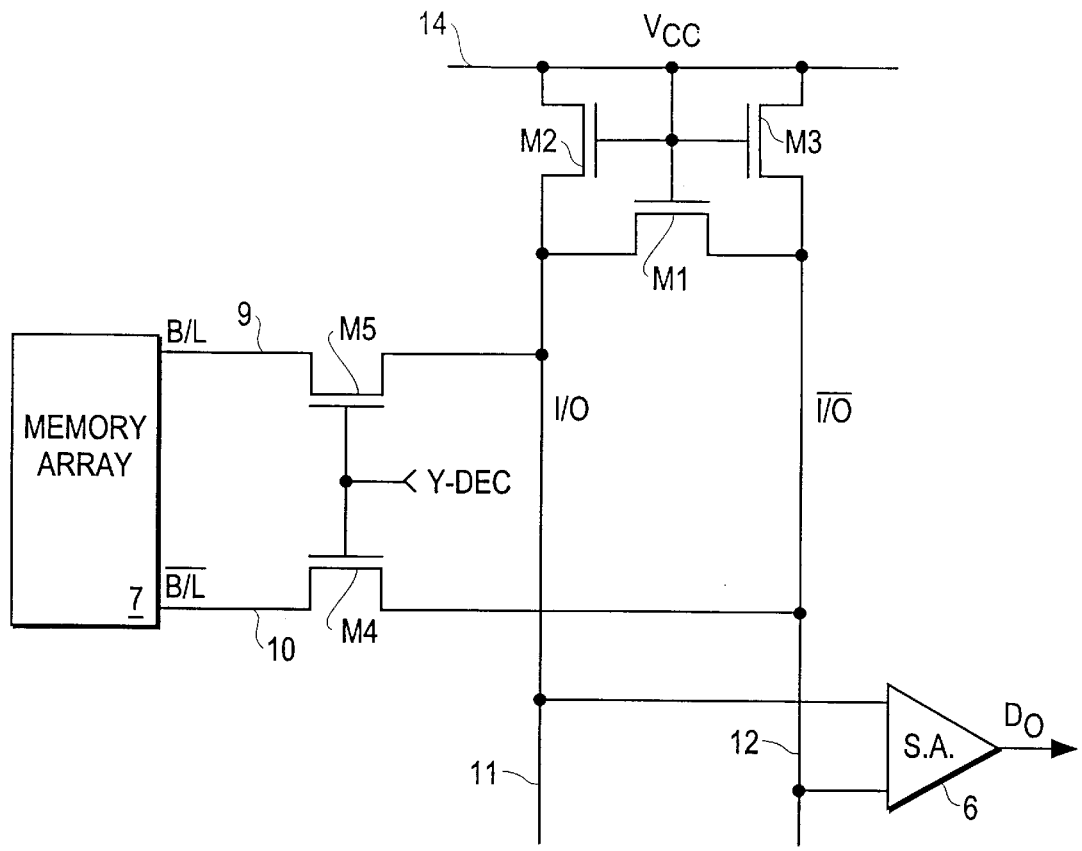
FIG. 1a shows a conventional Input/Output bias circuit used in MOS memory devices.
Figure 1B:
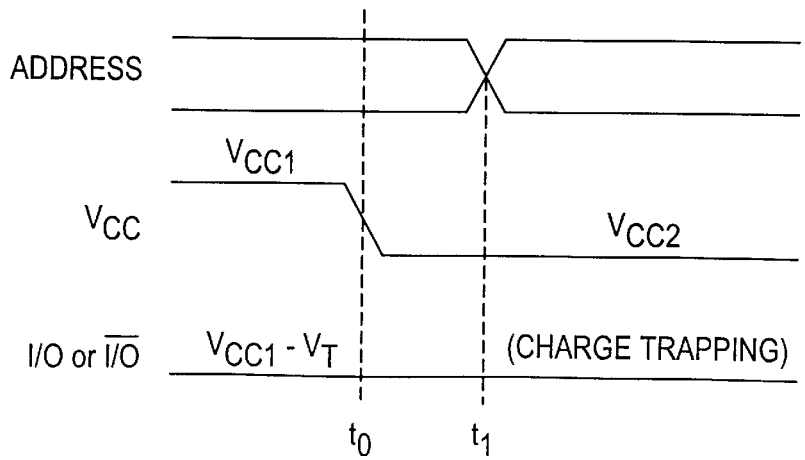

As described with respect to the prior art circuit of FIG. 1, prior to the start of the sensing cycle, it is critical that I/O 11 and $\overline{I/O}$ 12 lines are biased to proper voltage levels. Otherwise, the state of the selected memory cell may not be properly detected by the sense amplifier 6. Therefore, prior to time $t_2$ at which the sensing cycle starts, I/O 11 and $\overline{I/O}$ 12 lines need to be precharged and equalized to $V_{CC}$ minus Vt.

Prior to time $t_1$, with clocks φ1 and φ2 at low level, transistors M8 and M9 are fully on and transistors M6 and M7 are off, and as a result lines I/O 11 and $\overline{I/O}$ 12 are precharged to full $V_{CC}$. At time $t_1$, clocks φ1 and φ2 make a low to high transition. As a result, transistors M8 and M9 turn off and transistors M6 and M7 turn on. Under this condition, the voltage level on I/O 11 and $\overline{I/O}$ 12 lines are lowered from $V_{CC}$ to a predesignated voltage level, namely, $V_{CC}$ minus Vt. The $V_{CC}$ minus Vt voltage level is achieved by adjusting the duration the time clock φ1 remains high and selecting proper device sizes for transistors M2 and M3 which act as pull-up transistors and transistors M6 and M7 which act as pull-down transistors.

As can be seen, the primary purpose of clock φ1 is to turn on transistors M6 and M7 long enough to bring the voltage at I/O 11 and $\overline{I/O}$ 12 lines from $V_{CC}$ potential down to $V_{CC}$ minus Vt prior to start of the sensing cycle at time $t_2$.

As shown in FIG. 4b clock φ2 remains high during the period from $t_1$ to $t_3$ thereby keeping transistors M8 and M9 in the off state during that period of time. Initially during $t_1$ to $t_2$, transistors M1, M2 and M3 interact with transistors M6 and M7 to bias I/O 11 and $\overline{I/O}$ 12 to $V_{CC}$ minus Vt. Subsequently during $t_2$ to $t_3$, transistors M1, M2 and M3 interact with the developed signals on B/L 9 and $\overline{B/L}$ 10 in order to prepare the signals on I/O 11 and $\overline{I/O}$ 12 lines for sensing.

The falling edge of clock φ2 needs to be properly adjusted to provide sufficient time for development of signal as well as sensing of the signal by the sense amplifier 6. Note that $SA_{EN}$ signal remains high during the entire sensing cycle from time $t_2$ to $t_3$, thereby keeping the sense amplifier 6 enabled during that time. Also, note that the rising edge of the clocks φ1 and φ2 may be adjusted so that no transient crow-bar current from $V_{CC}$ terminal 14 to ground terminal 18 is conducted through transistors M9 and M7 or through transistors M8 and M6. This can be done by ensuring that the low to high transition on clock φ2 occurs prior to the low to high transition on clock φ1.

Figure 2:
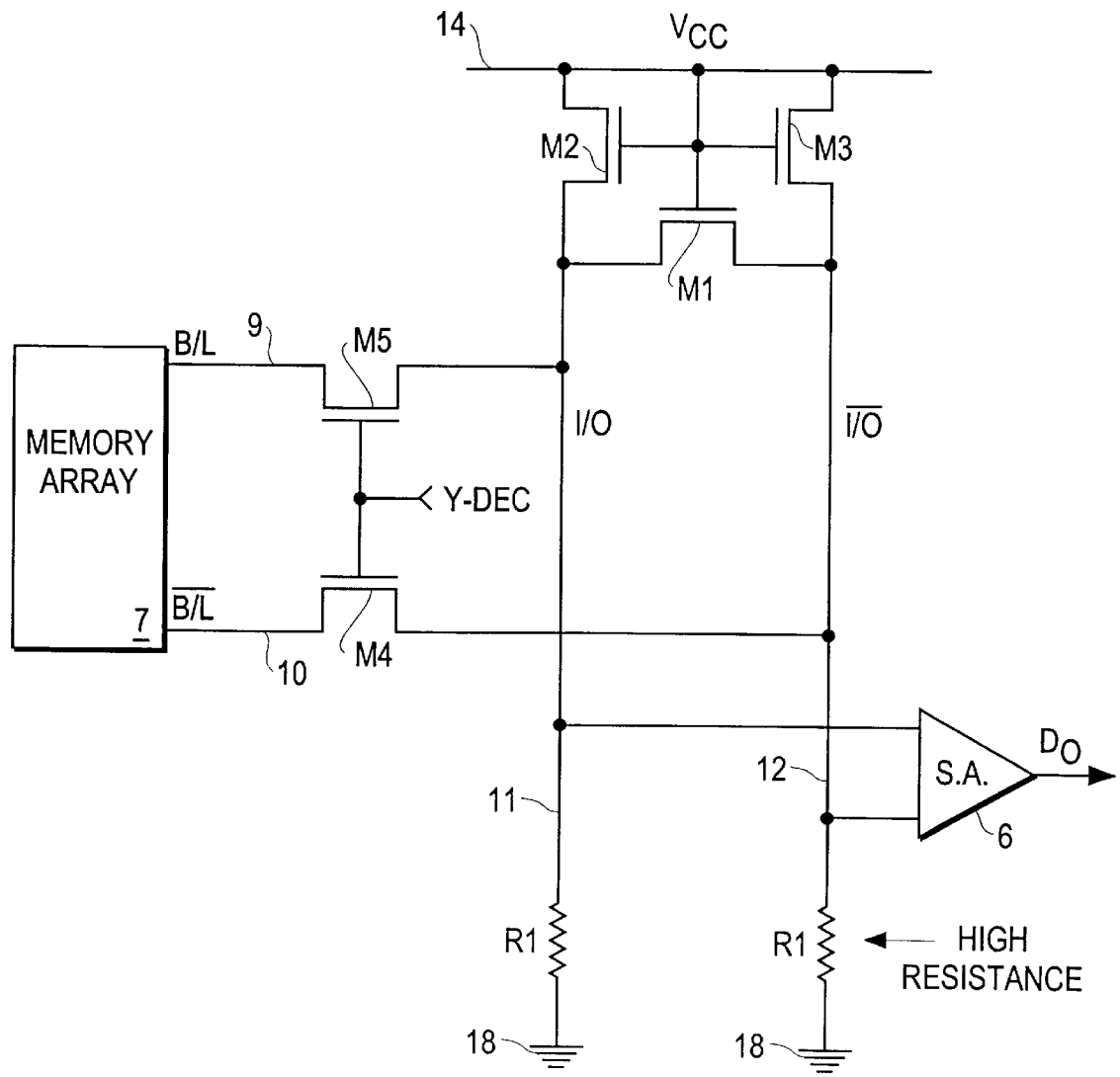
Figure 3A:
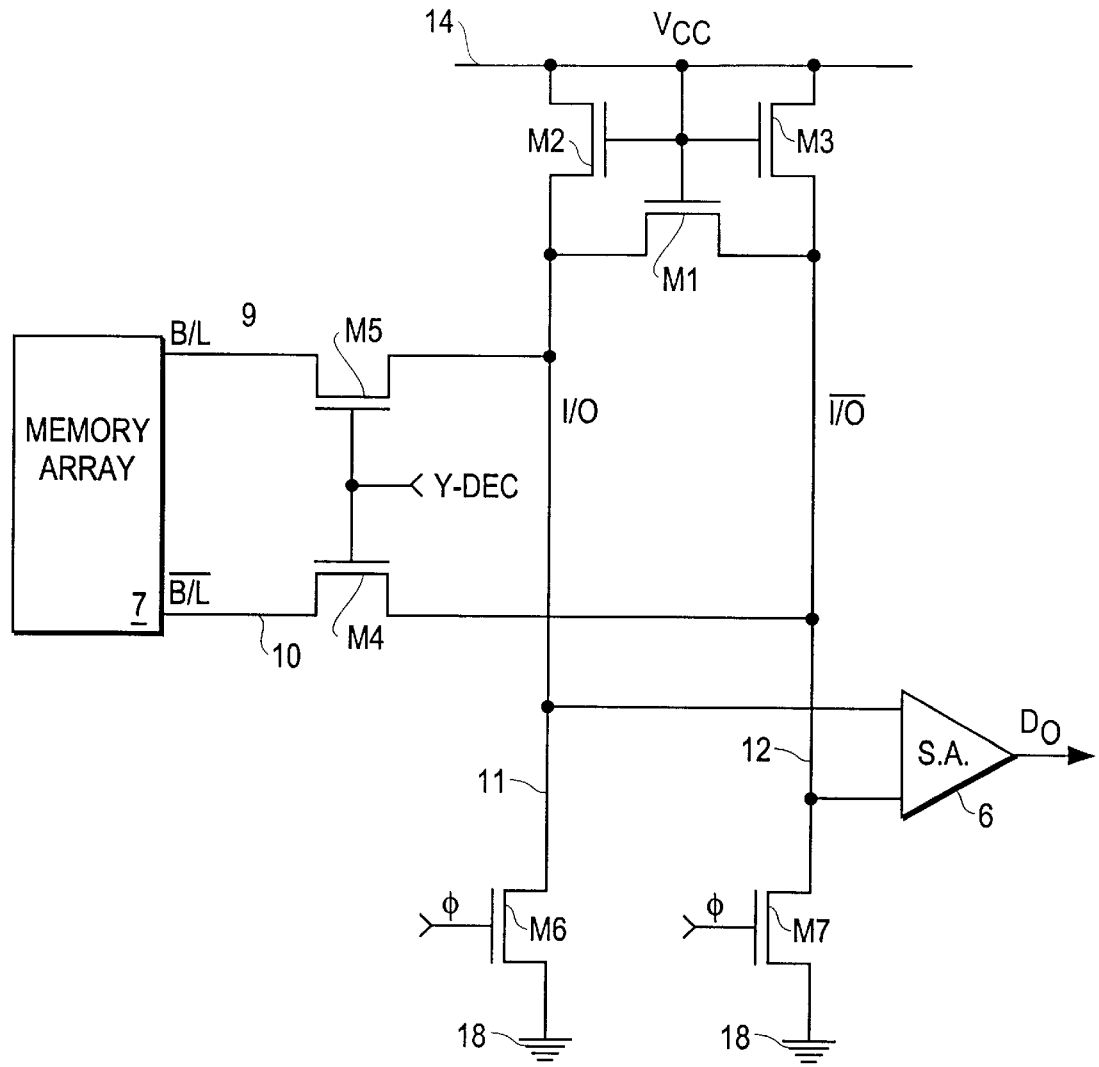
Figure 3B:
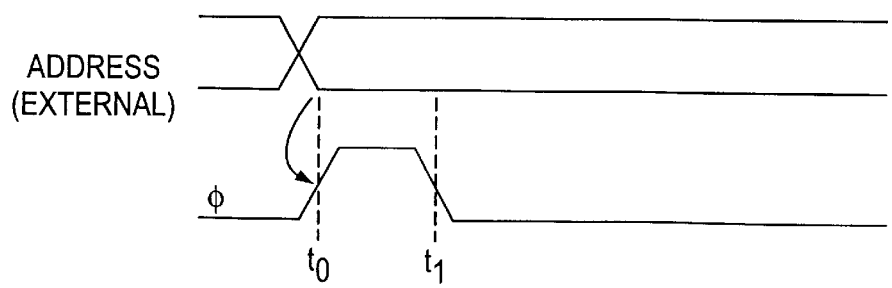
FIG. 3b shows the timing diagram for the circuit of FIG. 3b.

This scheme, unlike the circuits of FIGS. 1–3, is insensitive to abrupt and inadvertent changes in the $V_{CC}$ power supply. This is primarily due to I/O 11 and $\overline{I/O}$ 12 lines being directly connected to the $V_{CC}$ terminal 14 via transistors M8 and M9 under D.C. conditions, and as such, any variations on $V_{CC}$ will be directly reflected onto the I/O 11 and $\overline{I/O}$ 12 lines. For example, if $V_{CC}$ terminal drops from 5.5V to 4.5V just prior to the start of an address cycle, I/O 11 and $\overline{I/O}$ 12 lines will also drop from 5.5V to 4.5V since transistors M8 and M9 are fully on. With $V_{CC}$=4.5V after the start of the address cycle, at time $t_1$ lines I/O 11 and $\overline{I/O}$ 12 will discharge from 4.5V to 4.5V minus Vt through transistors M6 and M7. As can be seen, no charge trapping issues arise in this manner.

Note that under D.C. conditions I/O 11 and $\overline{I/O}$ 12 lines do not reflect the data corresponding to the selected memory cell, but rather are charged to full $V_{CC}$. As described earlier, this is made possible by using a latching scheme. The latching scheme is as follows: at time $t_3$ in FIG. 4b, the sensing cycle is complete and the data corresponding to the state of the selected memory cell is available on output terminal $D_0$. At that time, the data on output terminal $D_0$ is latched through a latch circuitry not shown in FIG. 4b. Once the data is latched on output terminal $D_0$, the sense amplifier 6 is disabled through $SA_{EN}$ signal. As shown in FIG. 4b, at time $t_3$ $SA_{EN}$ signal makes a high-to-low transition turning off transistor M10. With transistor M10 in the off state, the ground potential 18 is decoupled from the sense amplifier circuit 6 and as such the sense amplifier 6 is disabled. Disabling the sense amplifier 6 essentially results in decoupling I/O 11 and $\overline{I/O}$ 12 lines from the output terminal $D_0$. With the data latched on output terminal $D_0$ and the I/O 11 and $\overline{I/O}$ 12 lines decoupled from the output terminal $D_0$, I/O 11 and $\overline{I/O}$ 12 lines are free to be precharged to any potential desired, i.e., to $V_{CC}$.

Clocks φ1 and φ2 may be internally generated using the Address Transition Detection (ATD) scheme commonly utilized in the design of memory devices or other internally generated clocking schemes, or may be externally generated.

The above description of the present invention is intended to be illustrative and not limiting. The invention is further intended to include all variations and modifications falling within the scope of the appended claims.

We claim:

1. A method for reading a memory device, the method comprising:

prior to a new read operation, maintaining a node voltage at substantially the same voltage as a power supply voltage, said node being selectively connectable to one or more memory cells, and said power supply voltage being within a predetermined range of voltages; and during at least an initial time period of said new read operation, driving said node voltage out of said predetermined range of voltages thus causing a biasing circuit to be enabled to bias said node.

2. A method as recited in claim 1 further comprising:

after said at least an initial time period, sensing a signal on said node, said signal corresponding to the state of a memory cell selected during said read operation.

3. A method as recited in claim 2 wherein said sensing step is carried out by a sense amplifier circuit enabled after said at least an initial time period.

4. A method as recited in claim 1 wherein, said maintaining step is carried out by a turned on PMOS transistor connected between said node and a power supply terminal, said power supply terminal carrying said power supply voltage, and said driving step is carried out by turning off said PMOS transistor and turning on a NMOS transistor connected between said node and a reference terminal.

5. A method as recited in claim 4 wherein said biasing circuit comprises an NMOS transistor with its gate and drain terminals connected to said power supply terminal and its source terminal connected to said node.

6. A method as recited in claim 5 wherein said predetermined range of voltages includes the range between said power supply voltage and one threshold voltage below said power supply voltage.

* * * * *